(12) United States Patent
Lo et al.

(10) Patent No.: US 9,792,993 B2
(45) Date of Patent: Oct. 17, 2017

(54) MEMORY CELL WITH HIGH ENDURANCE FOR MULTIPLE PROGRAM OPERATIONS

(71) Applicant: eMemory Technology Inc., Hsin-Chu (TW)

(72) Inventors: Chun-Yuan Lo, Taipei (TW); Shih-Chen Wang, Taipei (TW); Wen-Hao Ching, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/406,802

(22) Filed: Jan. 16, 2017

(65) Prior Publication Data
US 2017/0206969 A1 Jul. 20, 2017

Related U.S. Application Data

(60) Provisional application No. 62/280,683, filed on Jan. 19, 2016.

(51) Int. Cl.
*G11C 16/04* (2006.01)
*G11C 16/14* (2006.01)
*G11C 16/26* (2006.01)
*G11C 16/10* (2006.01)

(52) U.S. Cl.
CPC .............. *G11C 16/14* (2013.01); *G11C 16/10* (2013.01); *G11C 16/26* (2013.01)

(58) Field of Classification Search
CPC . G11C 16/0483; G11C 16/0475; G11C 16/14; G11C 16/0466; G11C 16/0416; G11C 16/08; G11C 16/0408; G11C 16/16; G11C 16/26; G11C 8/14; G11C 16/02; G11C 16/0441; G11C 16/28
USPC ............ 365/185.23, 185.18, 185.29, 185.13, 365/185.03, 185.1, 185.17, 185.26, 365/185.27, 185.28, 230.06, 185.01, 365/185.02, 185.05, 185.11
See application file for complete search history.

(56) References Cited

U.S. PATENT DOCUMENTS

| 5,331,590 | A | 7/1994 | Josephson |
| 7,209,392 | B2 | 4/2007 | Chen |
| 8,139,411 | B1 | 3/2012 | Pesavento |
| 2006/0018161 | A1* | 1/2006 | Chen ..................... H01L 27/115 365/185.28 |

* cited by examiner

*Primary Examiner* — Thong Q Le
(74) *Attorney, Agent, or Firm* — Winston Hsu

(57) ABSTRACT

A memory cell includes a read transistor, a first floating gate transistor, a program transistor, a second floating gate transistor, and a common floating gate. The common floating gate is coupled to the second floating gate transistor and the first floating gate transistor. The memory cell is programmed and erased through the common floating gate on the second floating gate transistor, and is read through the first floating gate transistor and the read transistor.

23 Claims, 8 Drawing Sheets

MEMORY CELL WITH HIGH ENDURANCE FOR MULTIPLE PROGRAM OPERATIONS

CROSS REFERENCE TO RELATED APPLICATIONS

This non-provisional application claims priority of U.S. provisional application No. 62/280,683, filed on Jan. 19, 2016, included herein by reference in its entirety.

BACKGROUND OF THE INVENTION

1. Field of the Invention

This invention is related to a memory cell, especially to a memory cell with high endurance for multiple program operations.

2. Description of the Prior Art

Non-volatile memory (NVM) is a type of memory that retains information it stores even when no power is supplied to memory blocks thereof.

Due to the wide range of applications for various uses, there is a growing need for a nonvolatile memory to be embedded in the same chip with the main circuit, especially for personal electronic devices having strict requirements for circuit area.

According to the programming times limit, non-volatile memory devices are divided into multi-time programmable (MTP) memory and one-time programmable (OTP) memory. A MTP nonvolatile memory cell of prior art includes one floating gate transistor for retaining data, and one or two select transistors for enabling the floating gate transistor to perform corresponding operations. The floating gate is controlled by two different coupling elements, one for program operations and one for erase operations.

Since the electrons are ejected or injected through the floating gate during the program operations and the erase operations, the floating gate is damaged as the number of operations grows. The defect on the floating gate will deteriorate the memory cell and make it difficult to identify the read current generated by the memory cell.

SUMMARY OF THE INVENTION

One embodiment of the present invention discloses a memory cell. The memory includes a read transistor, a first floating gate transistor, a program transistor, a second floating gate transistor, and a common floating gate.

The read select transistor has a first terminal coupled to a bit line, a second terminal, a control terminal coupled to a word line, and a body terminal coupled to a source line. The first floating gate transistor has a first terminal coupled to the second terminal of the read transistor, a second terminal coupled to the source line, and a body terminal coupled to the source line. The program select transistor has a first terminal coupled to an erase control line, a second terminal, a control terminal coupled to an operation control line, and a body terminal coupled to the erase control line. The second floating gate transistor has a first terminal coupled to the second terminal of the program transistor, a second terminal, and a body terminal coupled to the erase control line. The common floating gate is coupled to the first floating gate transistor and the second floating gate transistor. The read transistor, the first floating gate transistor, the program transistor, and the second floating gate transistor are formed by metal-oxide-semiconductors.

Another embodiment of the present invention discloses a memory array. The memory array includes a plurality of bit lines, a plurality of word lines, a plurality of operation control lines, a plurality of erase control lines, a plurality of source lines, and a plurality of rows of memory cells.

Each of memory cells includes a read transistor, a first floating gate transistor, a program transistor, a second floating gate transistor, and a common floating gate. The read select transistor has a first terminal coupled to a bit line of the plurality of bit lines, a second terminal, a control terminal coupled to a word line of the plurality of word lines, and a body terminal coupled to a source line of the plurality of source lines. The first floating gate transistor has a first terminal coupled to the second terminal of the read transistor, a second terminal coupled to the source line, and a body terminal coupled to the source line. The program select transistor has a first terminal coupled to an erase control line of the plurality of erase control lines, a second terminal, a control terminal coupled to an operation control line of the plurality of operation control lines, and a body terminal coupled to the erase control line. The second floating gate transistor has a first terminal coupled to the second terminal of the program transistor, a second terminal, and a body terminal coupled to the erase control line. The common floating gate is coupled to the first floating gate transistor and the second floating gate transistor.

Memory cells in a same row are coupled to a same word line, a same source line, and a same erase control line. Memory cells in a same column are coupled to a same bit line, and a same operation control line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
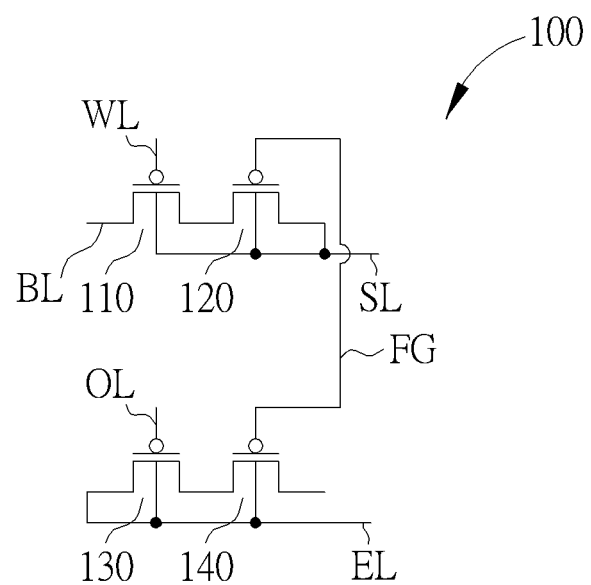
FIG. 1 shows a memory cell according to one embodiment of the present invention.

FIG. 1 shows a memory cell 100 according to one embodiment of the present invention. The memory cell 100 includes a read select transistor 110, a first floating gate transistor 120, a program select transistor 130, a second floating gate transistor 140, and a common floating gate FG.

The read select transistor 110 has a first terminal, a second terminal, a control terminal and a body terminal. The first terminal of the read select transistor 110 is coupled to a bit line BL, the control terminal of the read select transistor 110 is coupled to a word line WL, and the body terminal of the read select transistor 110 is coupled to a source line SL.

The first floating gate transistor 120 has a first terminal, a second terminal, a control terminal and a body terminal. The first terminal of the first floating gate transistor 120 is coupled to the second terminal of the read select transistor 110, the second terminal of the first floating gate transistor 120 is coupled to the source line SL, and the body terminal of the first floating gate transistor 120 is coupled to the source line SL.

The program select transistor 130 has a first terminal, a second terminal, a control terminal and a body terminal. The first terminal of the program select transistor 130 is coupled to an erase control line EL, the control terminal of the program select transistor 130 is coupled to an operation control line OL, and the body terminal of the program select transistor 130 is coupled to the erase control line EL.

The second floating gate transistor 140 has a first terminal, a second terminal, a control terminal and a body terminal. The first terminal of the second floating gate transistor 140 is coupled to the second terminal of the program select transistor 130, the second terminal of the second floating gate transistor 140 is floating, and the body terminal of the second floating gate transistor 140 is coupled to the erase control line EL. Also, the common floating gate FG is coupled to the first floating gate transistor 120 and the second floating gate transistor 140.

Figure 2:
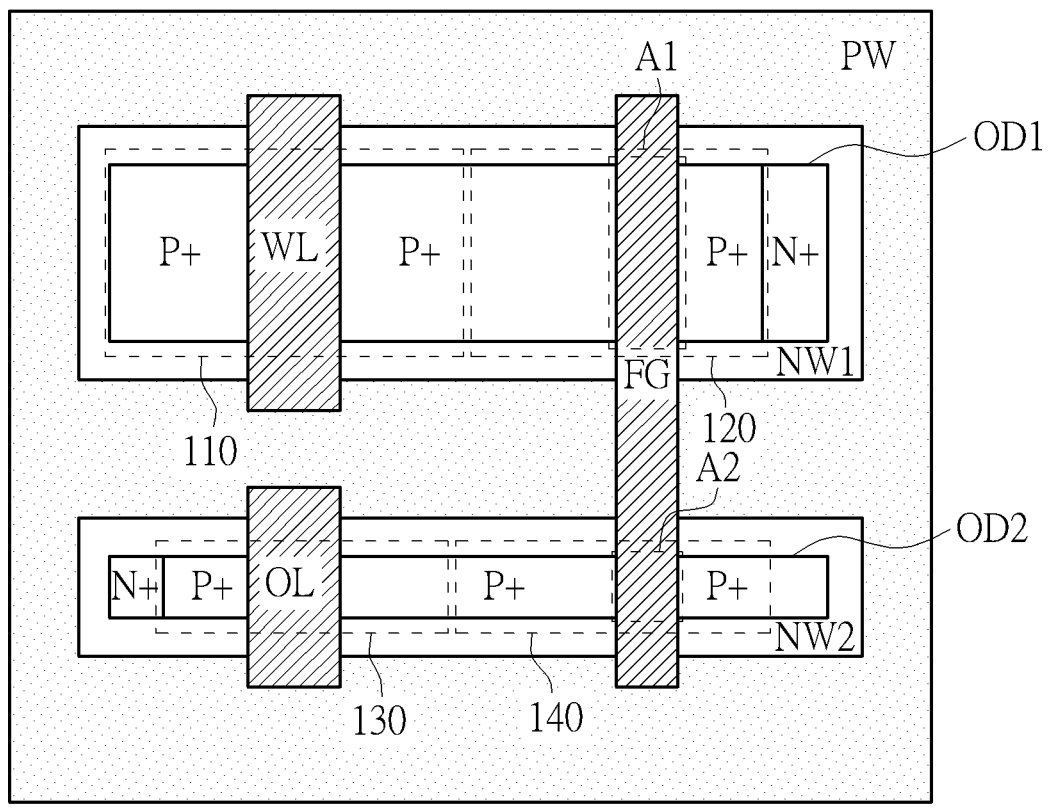
FIG. 2 shows a layout of the memory cell in FIG. 1.
Figure 3:
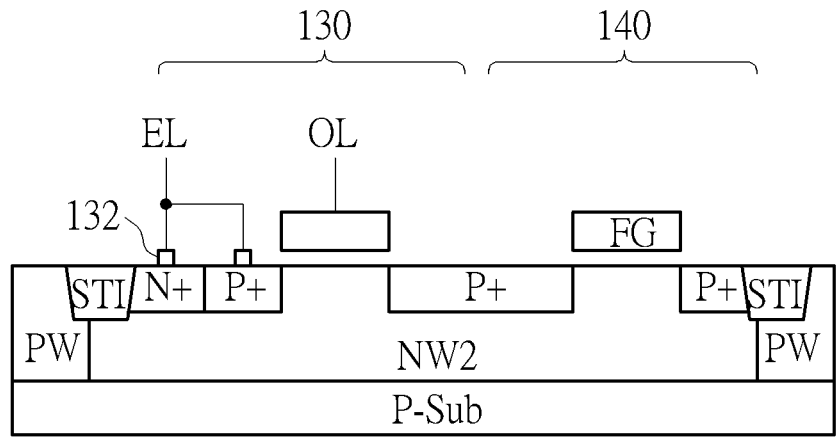
FIG. 3 shows a structure of the program select transistor and the second floating gate transistor of the memory cell in FIG. 1.

FIG. 2 shows a layout of the memory cell 100, and FIG. 3 shows a structure of the program select transistor 130 and the second floating gate transistor 140.

In FIGS. 2 and 3, the read select transistor 110, the first floating gate transistor 120, the program select transistor 130, and the second floating gate transistor 140 are formed by P-type metal-oxide-semiconductors (PMOS). Also, the read select transistor 110 and the first floating gate transistor 120 can be formed in an oxide diffusion region OD1 of a first N-well NW1 while the program select transistor 130 and the second floating gate transistor 140 can be formed in an oxide diffusion region OD2 of a second N-well NW2. In this embodiment, the first terminals and the second terminals of the read select transistor 110 and the first floating gate transistor 120 can be the P-type doped regions P+ disposed in the oxide diffusion region OD1 in the first N-well NW1, and the body terminals of the read select transistor 110 and the first floating gate transistor 120 can be the rest parts of the oxide diffusion region OD1. In some embodiments, the oxide diffusion region OD1 can be defined by the shallow trench isolation layer STI as shown in FIG. 3.

Similarly, the first terminals and the second terminals of the program select transistor 130 and the second floating gate transistor 140 can be the P-type doped regions P+ disposed in the oxide diffusion region OD2 in the second N-well NW2, and the body terminals of the program select transistor 130 and the second floating gate transistor 140 can be the rest parts of the oxide diffusion region OD2. The two N-wells NW1 and NW2 can be isolated by a P-well PW on a substrate P-sub.

In FIG. 3, the body terminal of the program select transistor 130 can be coupled to the erase control line EL through a contact 132, and the contact 132 can be formed on an N-type heavily doped region N+ in the oxide diffusion region OD2 in the N-well NW2. In FIGS. 2 and 3, the N-type heavily doped region N+ is disposed next to the program select transistor 130. However, in other embodiments, the N-type heavily doped region N+ can be disposed in other places in the oxide diffusion region OD2 in the N-well NW2. Since the second floating gate transistor 140 and the program select transistor 130 are disposed in the same N-well NW2, the body terminal of the second floating gate transistor 140 will be coupled to the erase control line EL as well.

Similarly, the read select transistor 110 and the first floating gate transistor 120 may have the similar structure of as the program select transistor 130 and the second floating gate transistor 140 shown in FIG. 3. Since the first floating gate transistor 120 and the read select transistor 110 are disposed in the oxide diffusion region OD1 of the same N-well NW1, the body terminals of the read select transistor 110 and the first floating gate transistor 120 can be coupled to the source line SL through a contact on the N-type heavily doped region N+ in the oxide diffusion region OD1 of the N-well NW1.

The common floating gate FG can be a layer of polysilicon formed above the first floating gate transistor 120 and second floating gate transistor 140. Therefore, the voltage of the common floating gate FG can be controlled by the voltage of the body terminal of the first floating gate transistor 120 and the voltage of the body terminal of the second floating gate transistor 140.

Furthermore, an overlap area A1 can be defined by an area on the oxide diffusion region OD1 overlapping the common floating gate FG while an overlap area A2 can be defined by an area on the oxide diffusion region OD2 overlapping the common floating fate FG as shown in FIG. 2. In the present embodiment, the overlap area A1 is greater than an overlap area A2. Therefore, the voltage of the common floating gate FG would be dominated by the voltage of the body terminal of the first floating gate transistor 120. In some embodiments, to ensure the domination of the first floating gate transistor 120, the overlap area A1 can be nine times greater than the overlap area A2.

Figure 4:
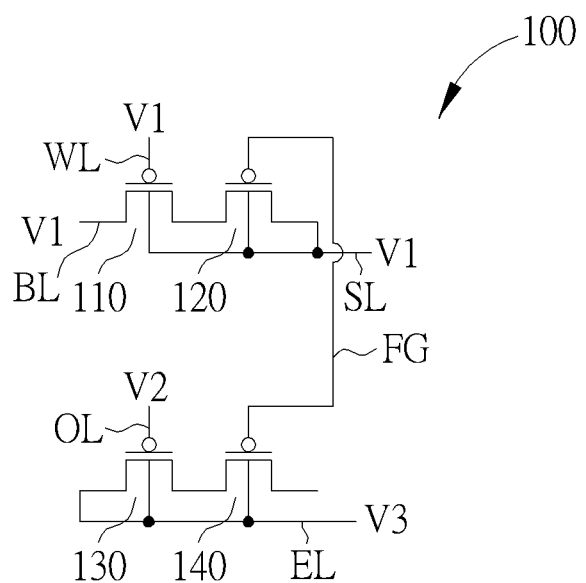
FIG. 4 shows voltages of the signals lines coupled to the memory cell in FIG. 1 during a program operation according to one embodiment of present invention.

FIG. 4 shows voltages of the signals lines coupled to the memory cell 100 during a program operation of the memory cell 100 according to one embodiment of present invention.

In FIG. 4, during the program operation of the memory cell 100, the source line SL, the bit line BL, and the word line WL are at a first voltage V1. Also, the operation control line OL is at a second voltage V2, and the erase control line EL is at a third voltage V3. The third voltage V3 is greater than the second voltage V2, and the second voltage V2 is greater than the first voltage V1. In some embodiments, the first voltage V1 can be a ground voltage of the system, the second voltage V2 can be 10V, and the third voltage V3 can be 18V.

Therefore, during the program operation of the memory cell 100, the common floating gate FG will be coupled to the first voltage V1 through the first floating gate transistor 120. In this case, since the body terminal of the second floating gate transistor 140 is at the third voltage V3, the great voltage gap applied to the second floating gate transistor 140 will induce the electron ejection. Therefore, the electrons reside in the common floating gate FG will be ejected to the body terminal of the second floating gate transistor 140. Meanwhile, the program select transistor 130 is turned on to ensure that the second floating gate transistor 140 will not enter the depletion mode. Consequently, the second floating gate transistor 140 can be programmed accordingly.

Figure 5:
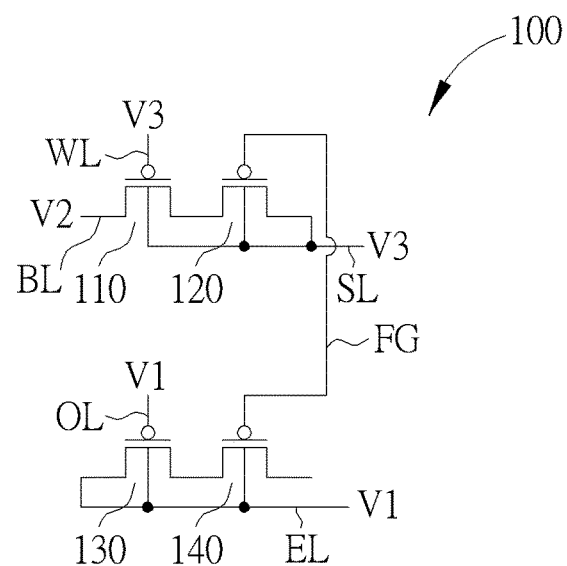
FIG. 5 shows voltages of the signals lines coupled to the memory cell in FIG. 1 during an erase operation according to one embodiment of present invention.

FIG. 5 shows voltages of the signals lines coupled to the memory cell 100 during an erase operation of the memory cell 100 according to one embodiment of present invention.

During the erase operation of the memory cell 100, the source line SL and the word line WL are at a third voltage V3, the bit line BL is at the second voltage V2, the operation control line OL is at the first voltage V1 or the second voltage V2, and the erase control line EL is at the first voltage V1.

That is, during the erase operation of the memory cell 100, the body terminal of the second floating gate transistor 140 is at the low voltage of first voltage V1 while the common floating gate FG is coupled to the high voltage of the third voltage V3 through the first floating gate transistor 120. Therefore, the great voltage gap applied to the second floating gate transistor 140 will induce the electron tunneling so that the electrons of the body terminal of the second floating gate transistor 140 will be injected to the common floating gate FG.

Figure 6:
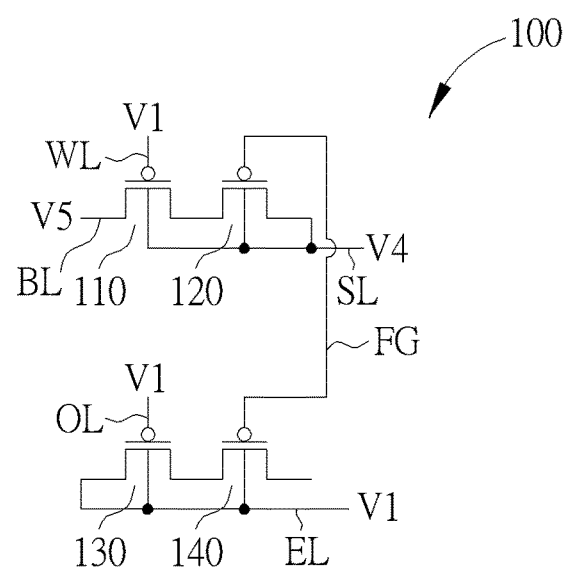
FIG. 6 shows voltages of the signals lines coupled to the memory cell in FIG. 1 during a read operation according to one embodiment of present invention.

FIG. 6 shows voltages of the signals lines coupled to the memory cell 100 during a read operation of the memory cell 100 according to one embodiment of present invention.

During the read operation of the memory cell 100, the source line SL is at a fourth voltage V4, the bit line BL is at a fifth voltage V5, and the word line WL, the operation control line OL, the erase control line EL are at the first voltage V1. The second voltage V2 is greater than the fourth voltage V4, the fourth voltage V4 is greater than the fifth voltage V5, and the fifth V5 voltage is greater than the first voltage V1. For example, the first voltage V1 can be a ground voltage of the system, the second voltage V2 can be 10V, the third voltage V3 can be 18V, the fourth voltage can be 5V, and the fifth voltage can be 3.8V.

That is, during the read operation of the memory cell 100, the read select transistor 110 is turned on while the program select transistor 130 is turned off. Also, the first floating gate transistor 120 and the second floating gate transistor 140 are kept in their previous status. Therefore, a read current is detected through the read select transistor 110 according to the status of the common floating gate FG. For example, if the memory cell 100 is programmed, there would be no electrons stored in the common floating gate FG. In this case, there would be no read current, or only tiny read current. On the contrary, if the memory cell 100 has not been programmed previously, or was programmed previously but has been erased afterwards, then an identifiable read current would be detected. Therefore, by judging the intensity of the read current, the information stored in the memory cell 100 can be identified.

Furthermore, since the electron is ejected or injected on the second floating gate transistor 140 while the read current is flowed through the read select transistor 110 and the first floating gate transistor 120, the defect on the second floating gate transistor 140 caused by the program and erase operations will not affect the generation of the read current. Therefore, because the write path and the read path of the memory cell 100 are separated, the memory cell 100 is able to endure more cycles of program and erase operations without deteriorating the reading ability.

Although the memory cell 100 shown in FIGS. 1 to 6 are formed by PMOS, in some embodiments, the read transistor, the first floating gate transistor, the program transistor, and the second floating gate transistor can be formed by N-type metal-oxide-semiconductors (NMOS).

Figure 7:
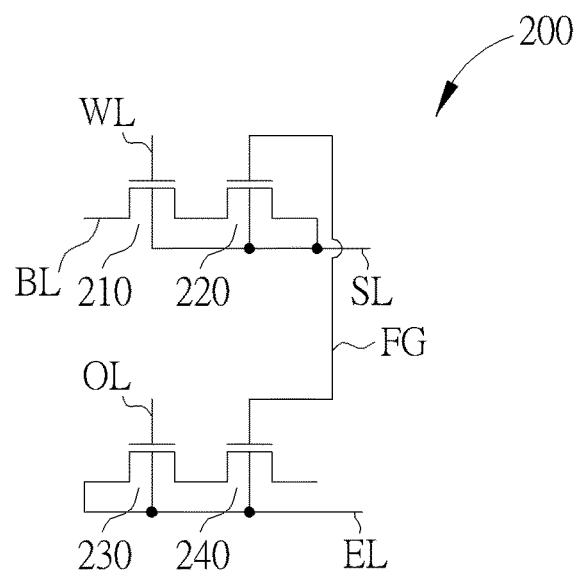
FIG. 7 shows a memory cell according to another embodiment of the present invention.
Figure 8:
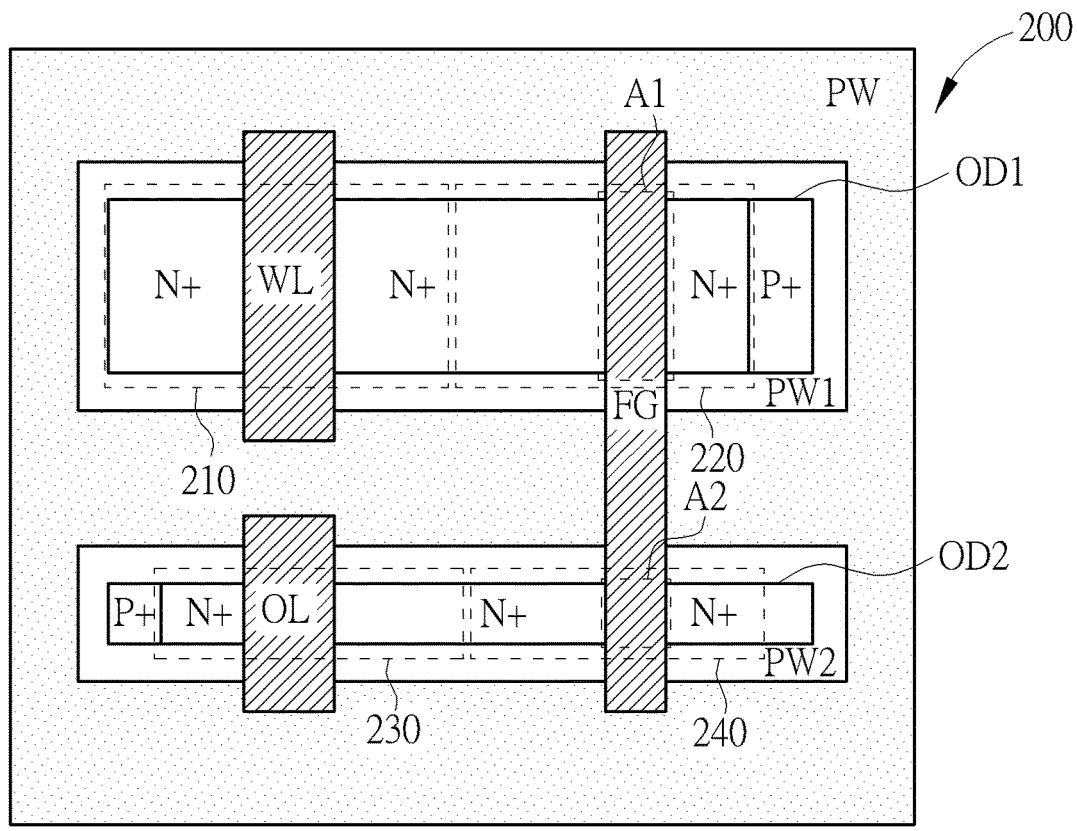
FIG. 8 shows a layout of the memory cell in FIG. 7.

FIG. 7 shows a memory cell 200 according to one embodiment of the present invention, and FIG. 8 shows a layout of the memory cell 200. The memory cell 200 has a similar structure as the memory cell 100. However, the read select transistor 210, the first floating gate transistor 220, the program select transistor 230, and the second floating gate transistor 240 of the memory cell 200 are formed by NMOS transistors. As shown in FIG. 8, the read select transistor 210 and the first floating gate transistor 220 are formed in a first P-well PW1. The program select transistor 230 and the second floating gate transistor 240 are formed in a second P-well PW2.

That is, the body terminals of the read select transistor 210, the first floating gate transistor 220, the program select transistor 230, and the second floating gate transistor 240 are formed by P-type doped wells. In this embodiment, the first P-well PW1 and the second P-well PW2 are disposed in a deep N-well DNW, so that the high voltage applied to the body terminals of the read select transistor 210, the first floating gate transistor 220, the program select transistor 230, and the second floating gate transistor 240 will not cause leakage current.

Figure 9:
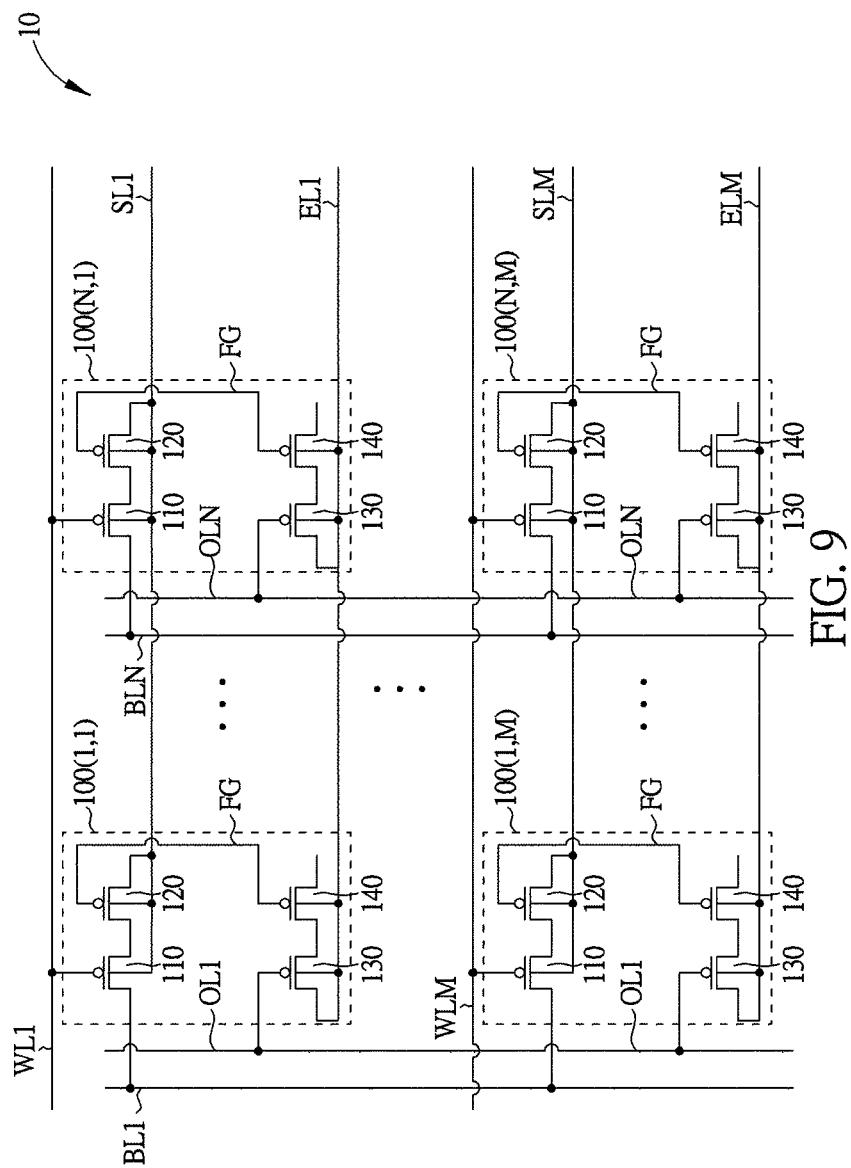
FIG. 9 shows a memory array according to one embodiment of the present invention.

FIG. 9 shows a memory array 10 according to one embodiment of the present invention. The memory array 10 includes N bit lines BL1 to BLN, M word lines WL1 to WLM, N operation control lines OL1 to OLN, M erase control lines EL1 to ELM, M source lines SL1 to SLM, and M rows of memory cells 100(1,1) to 100(N,1), . . . and 100(1,M) to (N,M). M and N are positive integers greater than 1.

Each of the memory cells 100(1,1) to 100(N, 1), . . . , and 100(1,M) to (N,M) can have the same structure as the memory cell 100 as shown in FIG. 1. Also, in FIG. 9, memory cells in the same row can be coupled to the same word line, the same source line, and the same erase control line while memory cells in the same column can be coupled to the same bit line, and the same operation control line.

For example, memory cells 100(1,1) and 100(N,1) are disposed in the same row. The memory cells 100(1,1) and 100(N,1) are coupled to the same word line WL1, the same source line SL1, and the same erase control line EL1. However, the memory cell 100(1,1) is coupled to the bit line BL1 and the operation control line OL1 while the memory cell 100(N,1) is coupled to the bit line BLN and the operation control line OLN. Similarly, memory cells 100(1, M) and 100(N,M) are disposed in the same row. The memory cells 100(1,M) and 100(N,M) are coupled to the same word line WLM, the same source line SLM, and the same erase control line ELM. However, the memory cell 100(1,M) is coupled to the bit line BL1 and the operation control line OL1 while the memory cell 100(N,M) is coupled to the bit line BLN and the operation control line OLN.

Also, memory cells 100(1,1) and 100(1,M) are disposed in the same column. The memory cells 100(1,1) and 100(1, M) are coupled to the same bit line BL1 and the same operation control line OL1. However, the memory cell 100(1,1) is coupled to the word line WL1, the source line SL1, and the erase control line EL1 while the memory cell 100(1,M) is coupled to the word line WLM, the source line SLM, and the erase control line ELM. Similarly, memory cells 100(N,1) and 100(N,M) are disposed in a same column.

The memory cells 100(N,1) and 100(N,M) are coupled to the same bit line BLN and the same operation control line OLN. However, the memory cell 100(N,1) is coupled to the word line WL1, the source line SL1, and the erase control line EL1 while the memory cell 100(N,M) is coupled to the word line WLM, the source line SLM, and the erase control line ELM.

Figure 10:
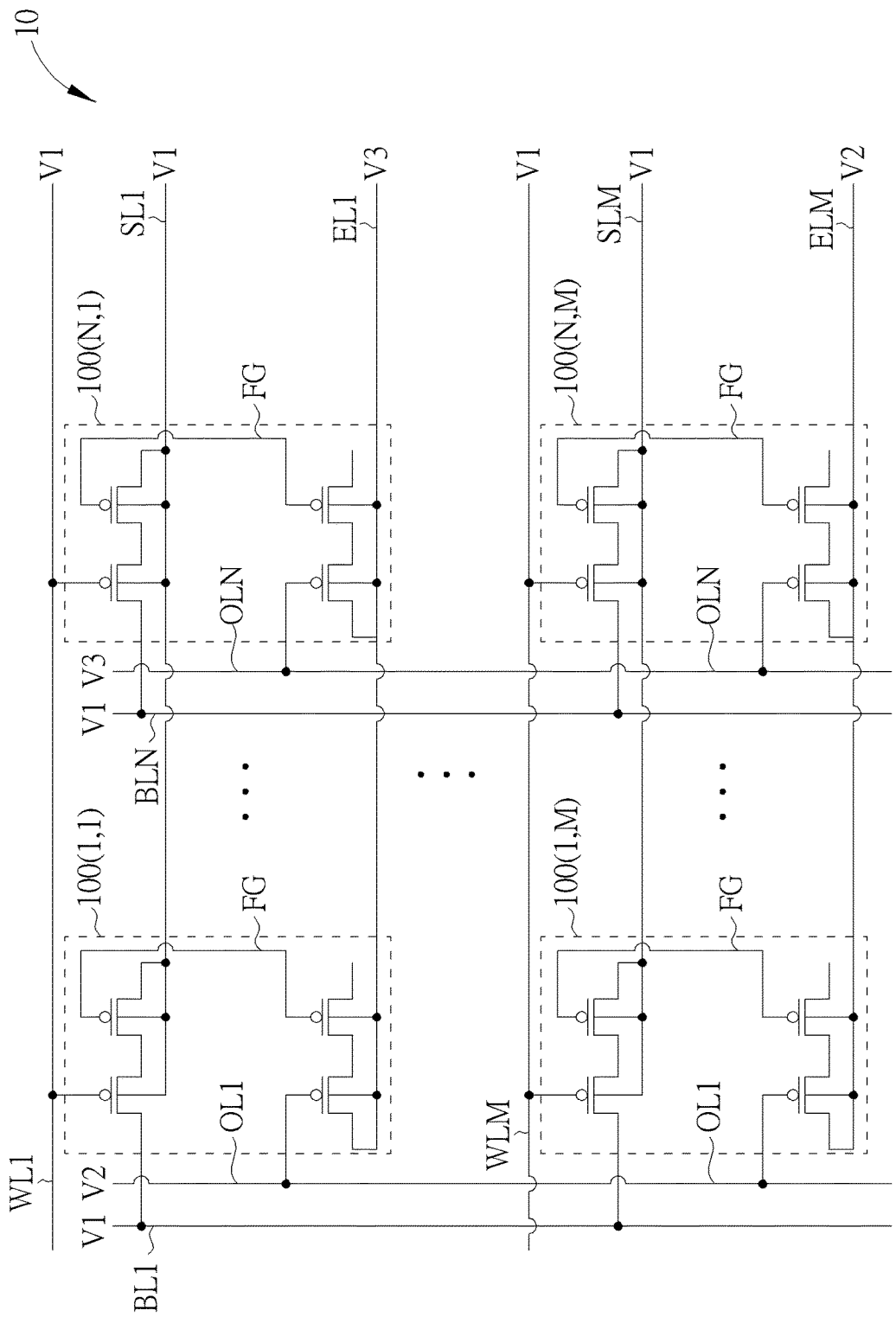
FIG. 10 shows voltages of the signals lines coupled to the memory array in FIG. 9 during a program operation of a memory cell according to one embodiment of present invention.

FIG. 10 shows voltages of the signals lines coupled to the memory array 10 during a program operation of the memory cell 100(1,1) according to one embodiment of present invention.

In FIG. 10, during the program operation of the memory cell 100(1,1), the source line SL1, the bit line BL1, and the word line WL1 are at the first voltage V1. Also, the operation control line OL1 is at the second voltage V2, and the erase control line EL1 is at the third voltage V3. The third voltage V3 is greater than the second voltage V2, and the second voltage V2 is greater than the first voltage V1. In some embodiments, the first voltage V1 can be a ground voltage of the system, the second voltage V2 can be 10V, and the third voltage V3 can be 18V.

In this case, the great voltage gap applied to the second floating gate transistor 140 of the memory cell 100(1,1) will cause the electron ejection from the common floating gate FG to the body terminal of the second floating gate transistor 140. Therefore, the electrons reside in the common floating gate FG of the memory cell 100(1,1) can be ejected to the body terminal of the second floating gate transistor 140 of the memory cell 100(1,1), and the memory cell 100(1,1) can be programmed.

However, during the program operation of the memory cell 100(1,1), the rest of the memory cells in the memory array 10 are not selected and should not be programmed. For example, the memory cell 100(N,1) and the memory cell 100(1,M).

The memory cell 100(N,1) is in a same row as the memory cell 100(1,1). In FIG. 10, during the program operation of the memory cell 100(1,1), the bit line BLN coupled to the unselected memory cell 100(N,1) is at the first voltage V1 while the operation control line OLN coupled to the unselected memory cell 100(N,1) is at the third voltage V3.

That is, during the program operation of the memory cell 100(1,1), the program select transistor 130 of the memory cell 100(N,1) is turned off. Therefore, the high voltage applied on the second floating gate transistor 140 of the memory cell 100(N,1) may cause channel depletion and will not induce the electron ejection from the common floating gate FG to the body terminal of the second floating gate transistor 140. Consequently, the memory cell 100(N,1) can be inhibited from being programmed during the program operation of the memory cell 100(1,1).

In addition, the memory cell 100(1,M) is in a same column as the memory cell 100(1,1). Since the memory cell 100(1,M) is also coupled to the operation control line OL1, which is at the second voltage V2 during the program operation of the memory cell 100(1,1), the erase control line ELM coupled to the memory cell 100(1,M) should not be too low; otherwise, the program select transistor 130 can be broken down due to the high voltage gap between the operation control line OL1 and the erase control line ELM. However, the erase control line ELM should not be too high; otherwise, the second floating gate transistor 140 of the memory cell 100(1,M) may be programmed unintentionally.

Therefore, in FIG. 10, during the program operation of the memory cell 100(1,1), the word line WLM and the source line SLM coupled to the unselected memory cell 100(1,M) are at the first voltage V1 while the erase control line ELM coupled to the unselected memory cell 100(1,M) is at the second voltage V2. In this case, for keeping an acceptable voltage gap on the program select transistor 130, the second voltage V2 can be 10V while the third voltage V3 can be 18V. Consequently, the voltage applied on the second floating gate transistor 140 of the memory cell 100(1,M) would not be high enough to induce electron ejection. Therefore, the memory cell 100(1,M) can be inhibited from being programmed during the program operation of the memory cell 100(1,1). Also, the program select transistor 130 of the memory cell 100(1,M) would not be damaged.

Figure 11:
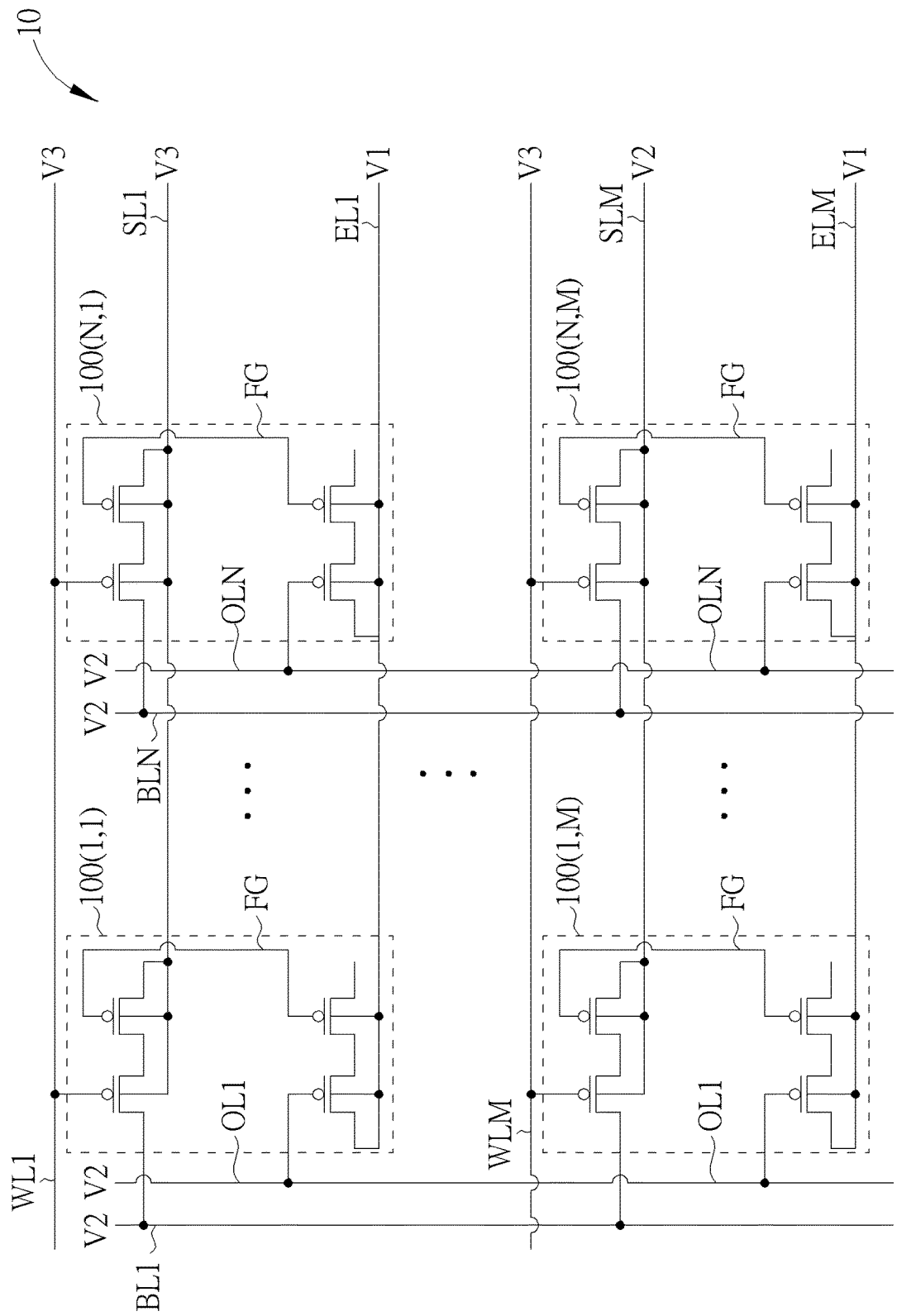
FIG. 11 shows voltages of the signals lines coupled to the memory array in FIG. 9 during an erase operation of a memory cell according to one embodiment of present invention.

FIG. 11 shows voltages of the signals lines coupled to the memory array 10 during an erase operation of the memory cell 100(1,1) according to one embodiment of present invention.

During the erase operation of the memory cell 100(1,1), the source line SL1 and the word line WL1 are at a third voltage V3, the bit line BL1 is at the second voltage V2, the operation control line OL1 is at the first voltage V1 or the second voltage V2, and the erase control line EL1 is at the first voltage V1. Therefore, the great voltage gap applied to the second floating gate transistor 140 of the memory cell 100(1,1) will cause the F-N tunneling so the memory cell 100(1,1) can be erased.

However, during the erase operation of the memory cell 100(1,1), the unselected memory cells in the memory array 10 should not be erased. In some embodiments of the present invention, the memory array 10 is erased row by row. For example, in FIG. 11, when the memory cell 100(1,1) is erased, the memory cells disposed in the same row as the memory cell 100(1,1), such as the memory cell (N,1), would be erased simultaneously. However, memory cells disposed in rows different from the memory cell 100(1,1) should not be erased.

For example, the memory cell 100(1,M) is disposed in a different row from the memory cell 100(1,1). Since the memory cell 100(1,M) is also coupled to the bit line BL1, which is at the second voltage V2, the voltage of the source line SLM coupled to the memory cell 100(1,M) should not be too low; otherwise, the read select transistor 110 of the memory cell 100(1,M) may be damaged. Also, the voltage of the source line SLM should not be too high, otherwise, the memory cell 100(1,M) may be erased unintentionally.

Therefore, in FIG. 11, during the erase operation of the memory cell 100(1,1), the word line WLM coupled to the unselected memory cell 100(1,M) is at the third voltage V3, the source line SLM coupled to the unselected memory cell 100(1,M) is at the second voltage V2, and the erase control line ELM coupled to the unselected memory cell 100(1,M) is at the first voltage V1.

In this case, for keeping an acceptable voltage gap on the read select transistor 110, the second voltage V2 can be 10V while the third voltage V3 can be 18V. Consequently, the voltage applied on the first floating gate transistor 120 of the memory cell 100(1,M) would not be high enough to induce F-N tunneling. Therefore, the memory cell 100(1,M) can be inhibited from being erased during the erase operation of the memory cell 100(1,1). Also, the read select transistor 110 of the memory cell 100(1,M) would not be damaged.

Figure 12:
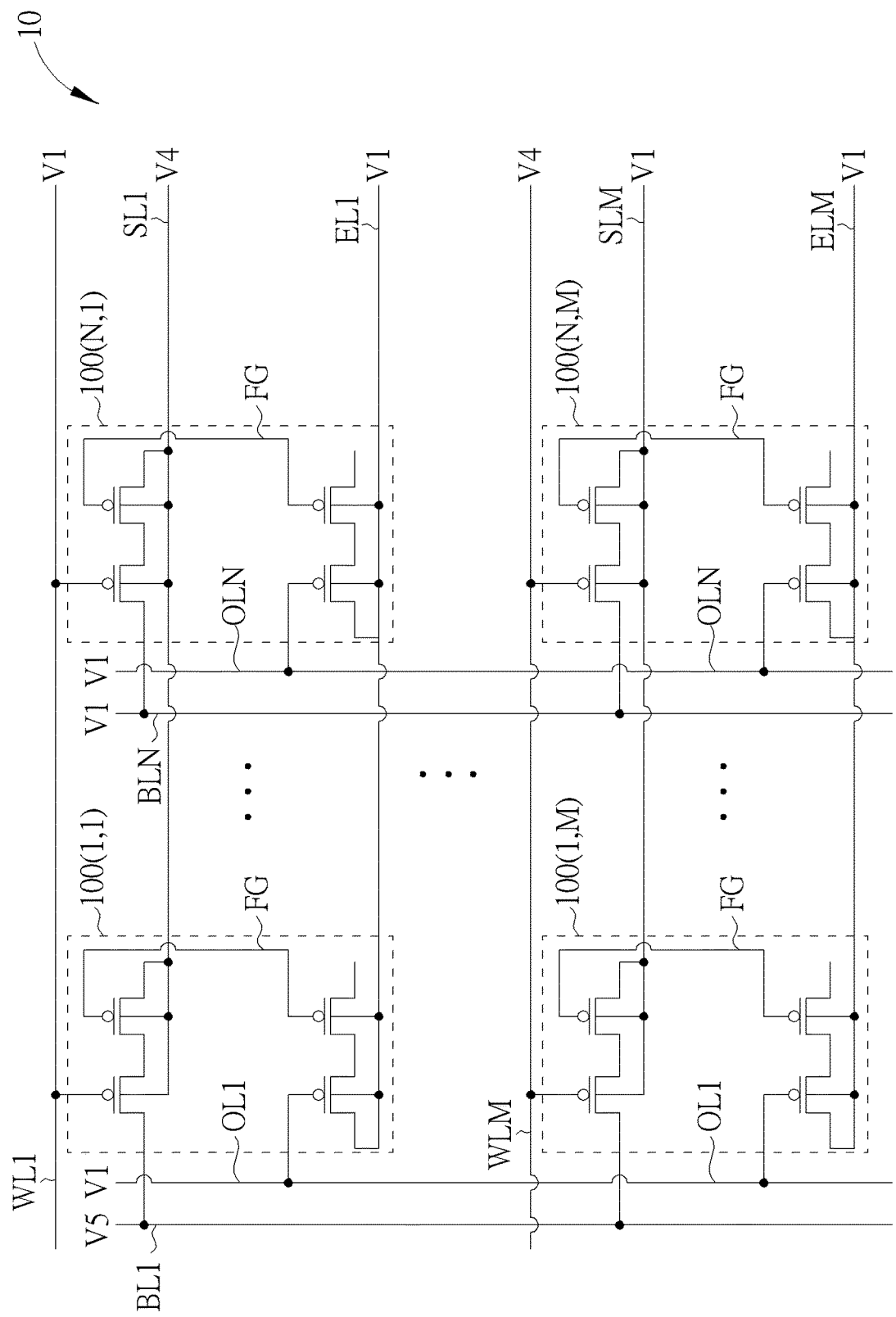
FIG. 12 shows voltages of the signals lines coupled to the memory array in FIG. 9 during a read operation of a memory cell according to one embodiment of present invention.

FIG. 12 shows voltages of the signals lines coupled to the memory array 10 during a read operation of the memory cell 100(1,1) according to one embodiment of present invention.

During the read operation of the memory cell 100(1,1), the source line SL1 is at the fourth voltage V4, the bit line BL1 is at the fifth voltage V5, and the word line WL1, the operation control line OL1, the erase control line EL1 are at the first voltage V1.

Since the fourth voltage V4 is greater than the fifth voltage V5, and the fifth voltage V5 is greater than the first voltage V1, the read select transistor 110 of the memory cell 100(1,1) can be turned on during the read operation of the memory cell 100(1,1). In some embodiments, the fourth voltage V4 can be 5V, the fifth voltage V5 can be 3.8V, and the first voltage V1 can be the ground voltage or 0V. Therefore, the read current is detected according to the status of the common floating gate FG of the memory cell 100(1, 1).

However, during the read operation of the memory cell 100(1,1), the unselected memory cells in the memory array 10 should not be read. For example, the memory cell 100(N,1) and the memory cell 100(1,M) should not be read.

The memory cell 100(N,1) is in a same row as the memory cell 100(1,1). In FIG. 12, during the read operation of the memory cell 100(1,1), the bit line BLN and the operation control line OLN coupled to the unselected memory cell 100(N,1) is at the first voltage V1. In this case, the read select transistor 110 of the memory cell 100(N,1) is turned off so that the memory cell 100(N,1) is not accessed.

Also, the memory cell 100(1,M) is in a different row from the memory cell 100(1,1). In FIG. 12, during the read operation of the memory cell 100(1,1), the word line WLM coupled to the unselected memory cell 100(1,M) is at the fourth voltage V4 while the source line SLM and erase control line ELM coupled to the unselected memory cell 100(1,M) are at the first voltage V1. In this case, the read select transistor 110 of the memory cell 100(1,M) can be turned off so that the memory cell 100(1,M) is not accessed.

In the memory array 10, since the electron is ejected and injected on the second floating gate transistors 140 of the memory cells 100(1,1) to 100(N,M) while the read current can be detected through the read select transistors 110 and the first floating gate transistors 120 of the memory cells 100(1,1) to 100(N,M), the defects on the second floating gate transistors 140 of the memory cells 100(1,1) to 100(N, M) caused by the program and erase operations will not affect the read current. Therefore, because the write path and the read path of the memory array 10 are separated, the memory array 10 is able to endure more cycles of program and erase operations without deteriorating the reading ability.

Furthermore, in some embodiments, the memory array 10 can adopt the memory cell 200 as shown in FIG. 7 instead of the memory cell 100. By controlling the signals properly, the memory array with memory cells 200 can still function normally while having better endurance.

In summary, according to the memory cells and the memory arrays provided by the embodiments of the present invention, the common floating gate would be programmed/erased through the second floating gate transistor while being read through the first floating gate transistor and the read transistor. Therefore, the defect on the common floating gate or the second floating gate transistor will not affect the read current detected by the first floating gate transistor and the read transistor. Consequently, the memory cell and the memory array of the present invention are able to endure more cycles of program and erase operations without deteriorating the reading ability.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A memory cell comprising:
    a read select transistor having a first terminal coupled to a bit line, a second terminal, a control terminal coupled to a word line, and a body terminal coupled to a source line;
    a first floating gate transistor having a first terminal coupled to the second terminal of the read transistor, a second terminal coupled to the source line, and a body terminal coupled to the source line;
    a program select transistor having a first terminal coupled to an erase control line, a second terminal, a control terminal coupled to an operation control line, and a body terminal coupled to the erase control line;
    a second floating gate transistor having a first terminal coupled to the second terminal of the program transistor, a second terminal, and a body terminal coupled to the erase control line; and
    a common floating gate coupled to the first floating gate transistor and the second floating gate transistor.

2. The memory cell of claim 1, wherein a first overlap area on a first oxide diffusion region overlapping the common floating gate is greater than a second overlap area on a second oxide diffusion region overlapping the common floating gate.

3. The memory cell of claim 1, wherein the read transistor, the first floating gate transistor, the program transistor, and the second floating gate transistor are formed by P-type metal-oxide-semiconductors (PMOS).

4. The memory cell of claim 3, wherein:
    the read select transistor and the first floating gate transistor are formed in a first N-well; and
    the program select transistor and the second floating gate transistor are formed in a second N-well.

5. The memory cell of claim 3, wherein during a program operation of the memory cell:
    the source line is at a first voltage (0V);
    the bit line is at the first voltage (0V);
    the word line is at the first voltage (0V);
    the operation control line is at a second voltage (10V); and
    the erase control line is at a third voltage (18V);
    wherein the third voltage is greater than the second voltage, and the second voltage is greater than the first voltage.

6. The memory cell of claim 5, wherein during a read operation of the memory cell:
    the source line is at a fourth voltage (5V);
    the bit line is at a fifth voltage (3.8V);
    the word line is at the first voltage (0V);
    the operation control line is at the first voltage (0V); and
    the erase control line is at the first voltage (0V);
    wherein the second voltage is greater than the fourth voltage, the fourth voltage is greater than the fifth voltage, and the fifth voltage is greater than the first voltage.

7. The memory cell of claim 3, wherein during an erase operation of the memory cell:
    the source line is at a third voltage (18V);
    the bit line is at a second voltage (10V);
    the word line is at the third voltage (18V);
    the operation control line is at a first voltage or the second voltage (10V); and
    the erase control line is at the first voltage (0V);

wherein the third voltage is greater than the second voltage, and the second voltage is greater than the first voltage.

8. The memory cell of claim 1, wherein the read transistor, the first floating gate transistor, the program transistor, and the second floating gate transistor are formed by N-type metal-oxide-semiconductors (NMOS).

9. The memory cell of claim 8, wherein:
the read select transistor and the first floating gate transistor are formed in a first P-well;
the program select transistor and the second floating gate transistor are formed in a second P-well; and
the first P-well and the second P-well are disposed in a deep N-well.

10. A memory array comprising:
a plurality of bit lines;
a plurality of word lines;
a plurality of operation control lines;
a plurality of erase control lines;
a plurality of source lines; and
a plurality of rows of memory cells, each comprising:
  a read select transistor having a first terminal coupled to a bit line of the plurality of bit lines, a second terminal, a control terminal coupled to a word line of the plurality of word lines, and a body terminal coupled to a source line of the plurality of source lines;
  a first floating gate transistor having a first terminal coupled to the second terminal of the read transistor, a second terminal coupled to the source line, and a body terminal coupled to the source line;
  a program select transistor having a first terminal coupled to an erase control line of the plurality of erase control lines, a second terminal, a control terminal coupled to an operation control line of the plurality of operation control lines, and a body terminal coupled to the erase control line;
  a second floating gate transistor having a first terminal coupled to the second terminal of the program transistor, a second terminal, and a body terminal coupled to the erase control line; and
  a common floating gate coupled to the first floating gate transistor and the second floating gate transistor;
wherein:
memory cells in a same row are coupled to a same word line, a same source line, and a same erase control line; and
memory cells in a same column are coupled to a same bit line, and a same operation control line.

11. The memory array of claim 10, wherein a first overlap area on a first oxide diffusion region overlapping the common floating gate is greater than a second overlap area on a second oxide diffusion region overlapping the common floating gate.

12. The memory array of claim 10, wherein the read transistor, the first floating gate transistor, the program transistor, and the second floating gate transistor are formed by P-type metal-oxide-semiconductors (PMOS).

13. The memory array of claim 12, wherein:
the read select transistor and the first floating gate transistor are formed in a first N-well; and
the program select transistor and the second floating gate transistor are formed in a second N-well.

14. The memory array of claim 12, wherein during a program operation of the memory cell:
the source line is at a first voltage (0V);
the bit line is at the first voltage (0V);
the word line is at the first voltage (0V);
the operation control line is at a second voltage (10V); and
the erase control line is at a third voltage (18V);
wherein the third voltage is greater than the second voltage, and the second voltage is greater than the first voltage.

15. The memory array of claim 14, wherein during the program operation of the memory cell:
a bit line coupled to an unselected memory cell in a same row as the memory cell is at the first voltage (0V); and
an operation control line coupled to the unselected memory cell is at the third voltage (18V).

16. The memory array of claim 14, wherein during the program operation of the memory cell:
a word line coupled to an unselected memory cell in a same column as the memory cell is at the first voltage (0V);
a source line coupled to the unselected memory cell is at the first voltage (0V); and
an erase control line coupled to the unselected memory cell is at the second voltage (10V).

17. The memory array of claim 14, wherein during a read operation of the memory cell:
the source line is at a fourth voltage (5V);
the bit line is at a fifth voltage (3.8V);
the word line is at the first voltage (0V);
the operation control line is at the first voltage (0V); and
the erase control line is at the first voltage (0V);
wherein the second voltage is greater than the fourth voltage, the fourth voltage is greater than the fifth voltage, and the fifth voltage is greater than the first voltage.

18. The memory array of claim 17, wherein during the read operation of the memory cell:
a bit line coupled to an unselected memory cell in a same row as the memory cell is at the first voltage (0V); and
an operation control line coupled to the unselected memory cell is at the first voltage (0V).

19. The memory array of claim 17, wherein during the read operation of the memory cell:
a word line coupled to an unselected memory cell in a same column as the memory cell is at the fourth voltage (5V);
a source line coupled to the unselected memory cell is at the first voltage (0V); and
an erase control line coupled to the unselected memory cell is at the first voltage (0V).

20. The memory array of claim 12, wherein during an erase operation of the memory cell:
the source line is at a third voltage (18V);
the bit line is at a second voltage (10V);
the word line is at the third voltage (18V);
the operation control line is at a first voltage (0V) or the second voltage (10V); and
the erase control line is at the first voltage (0V);
wherein the third voltage is greater than the second voltage, and the second voltage is greater than the first voltage.

21. The memory array of claim 20, wherein during the erase operation of the memory cell:
a word line coupled to an unselected memory cell in a same column as the memory cell is at the third voltage (18V);
a source line coupled to the unselected memory cell is at the second voltage (10V); and
an erase control line coupled to the unselected memory cell is at the first voltage (0V).

22. The memory array of claim 10, wherein the read transistor, the first floating gate transistor, the program transistor, and the second floating gate transistor are formed by N-type metal-oxide-semiconductors (NMOS).

23. The memory array of claim 22, wherein:
the read select transistor and the first floating gate transistor are formed in a first P-well;
the program select transistor and the second floating gate transistor are formed in a second P-well; and
the first P-well and the second P-well are disposed in a deep N-well.

* * * * *